(12) United States Patent
Misawa et al.

(10) Patent No.: US 6,388,303 B1
(45) Date of Patent: May 14, 2002

(54) SEMICONDUCTOR DEVICE AND SEMICONDUCTOR DEVICE MANUFACTURE METHOD

(75) Inventors: Kaori Misawa; Kazunori Fujita, both of Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/533,974

(22) Filed: Mar. 23, 2000

(30) Foreign Application Priority Data

Apr. 21, 1999 (JP) .......................................... 11-113967

(51) Int. Cl.[7] .............................................. H01L 29/00
(52) U.S. Cl. ........................ 257/510; 257/513; 438/296; 438/424; 438/435
(58) Field of Search .............................. 257/506, 510, 257/513; 438/296, 424, 435

(56) References Cited

U.S. PATENT DOCUMENTS 5,433,794 A * 7/1995 Fazan et al. ................. 257/506
5,741,738 A * 4/1998 Mandelman et al. ........ 438/296
6,054,343 A * 4/2000 Ashburn ...................... 438/221

* cited by examiner

*Primary Examiner*—Trung Dang
(74) *Attorney, Agent, or Firm*—Armstrong, Westerman & Hattori, LLP.

(57) ABSTRACT

There is disclosed a semiconductor device in which trenches are formed at predetermined intervals on a silicon substrate. In each trench, a first silicon oxide film is formed with the upper region of the first silicon oxide film protruding from a main substrate surface. A second silicon oxide film is formed from a boundary of the upper region in the first silicon oxide film and substrate over to the substrate surface. The height of the second silicon oxide film from the substrate surface is smaller than that of the upper region from the substrate surface. An active region is defined/formed on the substrate surface by an isolating film formed of the first and second silicon oxide films. A gate oxide film is formed on an active region surface, and a gate electrode is formed on the gate oxide film and extended from the active region over to the upper part of the isolating film.

2 Claims, 11 Drawing Sheets

SEMICONDUCTOR DEVICE AND SEMICONDUCTOR DEVICE MANUFACTURE METHOD

BACKGROUND OF THE INVENTION

1. Field of the Invention

The present invention relates to a semiconductor device and a method of manufacturing the semiconductor device, particularly to a trench isolation structure in a semiconductor device and a method of forming the structure.

2. Description of the Related Art

In recent years, with the high integration and high densification of ULSI, there has been an increasing demand for finer isolation films. A selective oxidation process, known as the Local Oxidation of Silicon process (LOCOS), has been used in a conventional isolation technique. In the selective oxidation process, the oxidation of a silicon substrate advances to the peripheral lower part of a silicon nitride film as an oxidation resistant mask, and a so-called bird's beak is formed. As a result, even when the width of the silicon nitride film formed as the mask on the surface of the silicon substrate is set to a minimum isolation width, an active region is reduced in size. Specifically, the reduction of the isolation width reaches its limit.

Moreover, when the bird's beak is formed in the periphery of the isolation part, the surface of the element isolation part becomes uneven and defects are caused in performing a photolithography process to form semiconductor devices on the active region of the semiconductor substrate, this makes it difficult to perform a fine processing.

A trench isolation process is proposed as a technique of solving the problem.

An example of the trench isolation process as described in Japanese Patent Application Laid-Open No. 8118/1997 will be described hereinafter with reference to FIGS. 7A to 7C.

(1) After successively forming a silicon oxide film 52, a silicon nitride film 53, a polysilicon film 54 and a silicon oxide film 55 on the main surface of a semiconductor substrate 51, a trench 56 is formed by the lithography process, which extends through the films and reaches the inner side of the semiconductor substrate 51 (see FIG. 7A).

(2) After depositing a Boro-Phospho Silicate Glass (BPSG) film 57 as an isolating film on the entire main surface of the substrate 51 including the trench 56, the BPSG film 57 is thermally treated to cause reflow whereby the surface of the BPSG film 57 is flattened (see FIG. 7B).

(3) The BPSG film 57, silicon oxide film 55, polysilicon film 54 and silicon nitride film 53 are successively etched back, so that the 13PSG film (isolating film) 57 is contained substantially completely in the trench 56 of the semiconductor substrate 51 (see FIG. 7C).

In this conventional example, the silicon oxide film 52 remains in the active region divided by the trench 56. However, the surface of the silicon oxide film 52 is roughened by the chemical solution (thermal phosphoric acid at about 160° C.) used for removing the silicon nitride film and is also damaged by ion implantation so that its insulating film properties are deteriorated. As a result, the silicon oxide film 52 cannot be used as it is, for example, as the gate insulating film of an MOS transistor.

To overcome this, after the above-described conventional process, a thermal oxide film having excellent properties is usually formed by removing the silicon oxide film 52 using wet etching and subsequently thermally oxidizing the substrate surface (main surface).

However, in this case, as shown in FIG. 8, when the silicon oxide film 52 is removed, the BPSG film 57 embedded in the trench 56 is also influenced by the etching, and an edge 51a (hereinafter referred to as the trench edge) of the substrate 51 is exposed. Specifically, in the entire BPSG film 57 inside the trench 56, the portion in the vicinity of the boundary with the substrate 51 (the inner wall surface of the trench 56) is deposited in the initial stage of the forming process of the BPSG film 57. This portion has a lower film quality than the other portions of the BPSG film 57 in the trench 56, and has a higher etching rate than the other portions. Therefore, when the silicon oxide film 52 is removed, the upper end of the BPSG film 57 in the vicinity of the boundary is preferentially eroded, a recess 58 is formed on the inside of the trench 56 from the surface of the substrate 51, and the trench edge 51a is exposed. As a result, the following problems occur.

(1) In the gate insulating film (silicon oxide film) formed after the silicon oxide film 52 is removed, because uniform oxidation does not occur in the trench edge 51a, the silicon oxide film in the vicinity of the trench edge 51a becomes thin, which causes the defective voltage resistance of the gate insulating film.

(2) When the gate electrode of a MOS transistor is configured to cover the active region and the upper part of the isolating film 57, an electric field is concentrated in the trench edge 51a, thereby causing the off leak phenomenon or narrow channel effect in the transistor.

SUMMARY OF THE INVENTION

Wherefore, an object of the present invention is to provide a semiconductor device and a method of manufacturing the semiconductor device which solve the above-described problems.

To attain this and other objects, according to the present invention, there is provided a semiconductor device including a substrate in which a trench is formed on a main surface, and an isolating film formed in the trench. The isolating film has a main body region positioned in the trench, a first region protruding upward from the main body region and positioned above the main surface, and a second region formed as the region extended along the main surface from the side surface of the first region and having a smaller height of a vertical direction from the main surface than the height of the vertical direction of the first region.

According to the present invention, since a trench edge is covered with the second region of the isolating film formed in the trench, the trench edge is prevented from being exposed.

Moreover, in this case, a conductive layer may be formed to ride over the upper part of the isolating film from the main surface.

In this case, the height of the first region is greater than the height of the second region, and a step between the main surface and the top surface of the isolating film increases in a stepwise manner. Therefore, when the conductive layer is formed from the main surface over to the top surface of the isolating film, the thickness of the conductive layer in the boundary between the isolating film and the main surface becomes smaller than that in the conventional art. As a result, when this conductive layer is etched and processed as a wiring layer, such as a gate electrode extended from the main surface over to the top surface of the isolating film, an unnecessary conductive layer does not remain in the boundary, so that the wiring layer can be prevented from being energized in an unnecessary part in the boundary when the semiconductor device is in use.

Moreover, according to the present invention, there is provided a semiconductor device manufacture method including: (a) a step of forming a first insulating film on a main surface which is one surface of a substrate; (b) a step of forming a trench passed through at least the first insulating film and reaching the inside of the substrate; (c) a step of forming a second insulating film having an upper region protruded upward more than the top surface of the first insulating film in the trench; (d) a step of forming a third insulating film having properties different from those of the first insulating film in a boundary with the second insulating film on the first insulating film; and (e) a step of using the third insulating film as a mask to etch the first insulating film.

In this method, by using the third insulating film as the mask and etching the first insulating film, at least a part of the first insulating film under the third insulating film remains along the substrate surface (main surface) from the second insulating film, and therefore the trench edge is prevented from being exposed.

BRIEF DESCRIPTION OF THE DRAWINGS

Embodiments of the present invention will be described hereinafter, by way of example, with reference to the accompanying drawings, in which.

DETAILED DESCRIPTION OF THE PREFERRED EMBODIMENTS

[First Embodiment]

Figure 1:
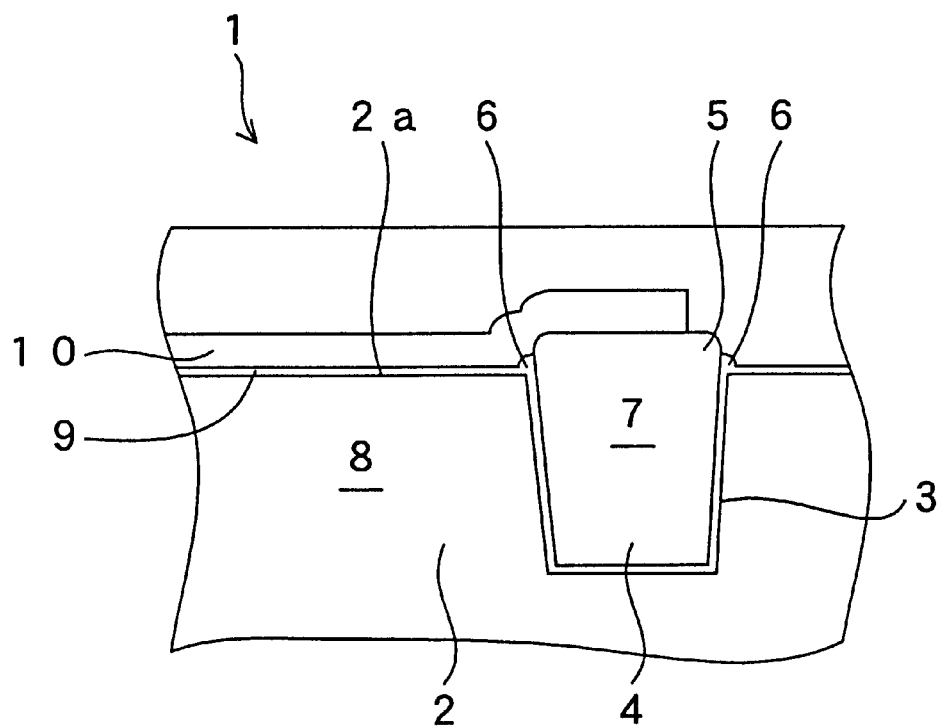
FIG. 1 is a schematic sectional view showing a semiconductor device according to a first embodiment of the present invention.
Figure 2A:
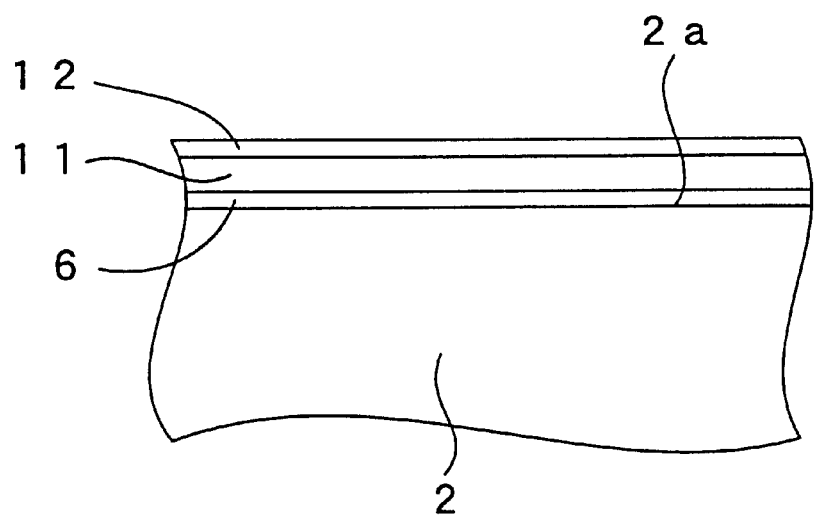
FIGS. 2A to 2J are schematic sectional views showing the manufacture process of the semiconductor device of the first embodiment.
Figure 2B:
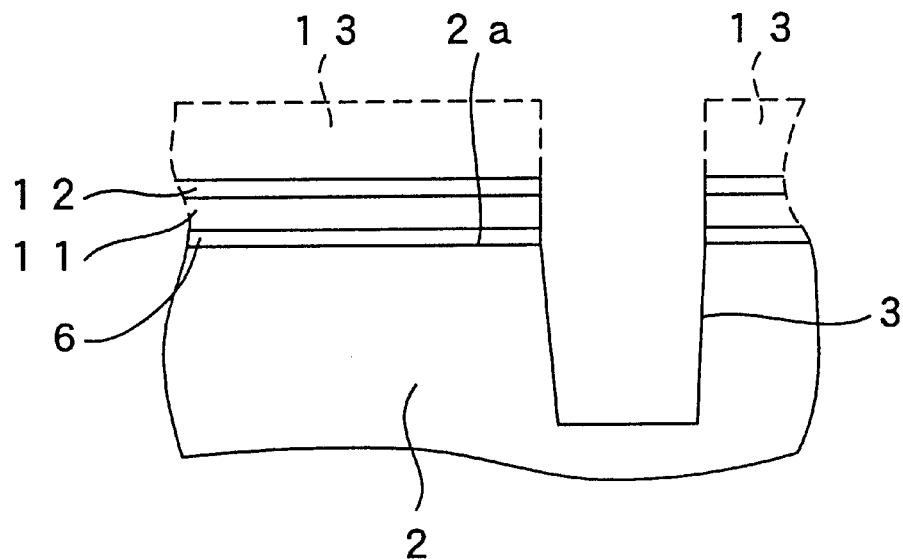
Figure 2C:
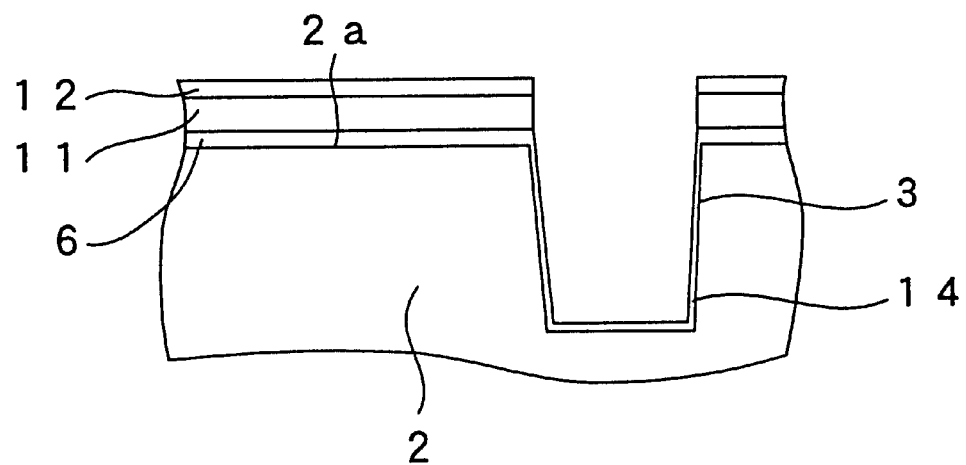
Figure 2D:
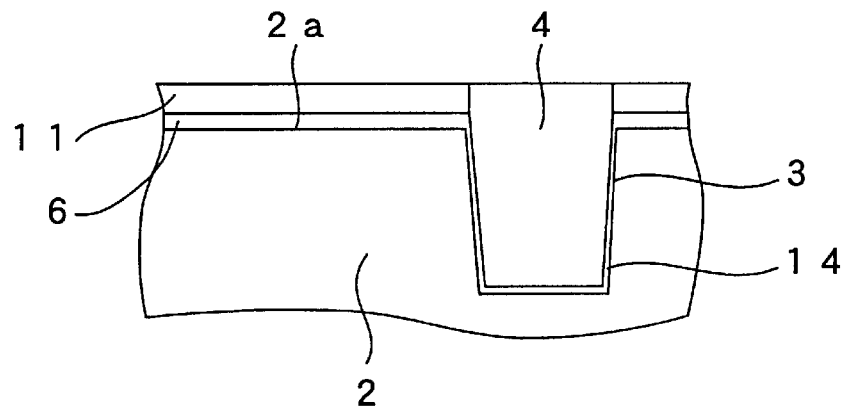
Figure 2E:
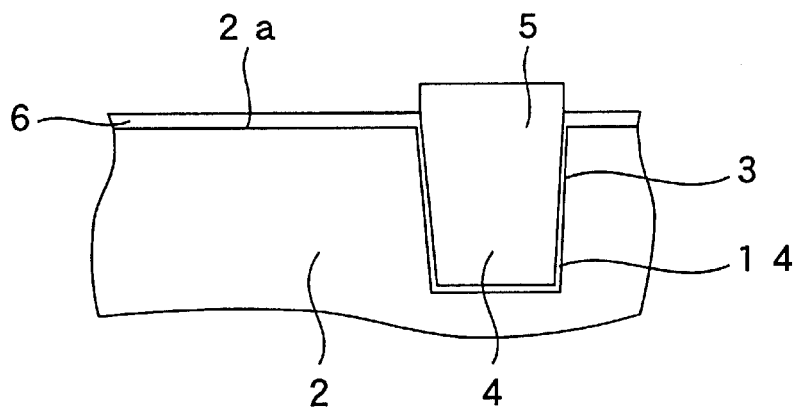
Figure 2F:
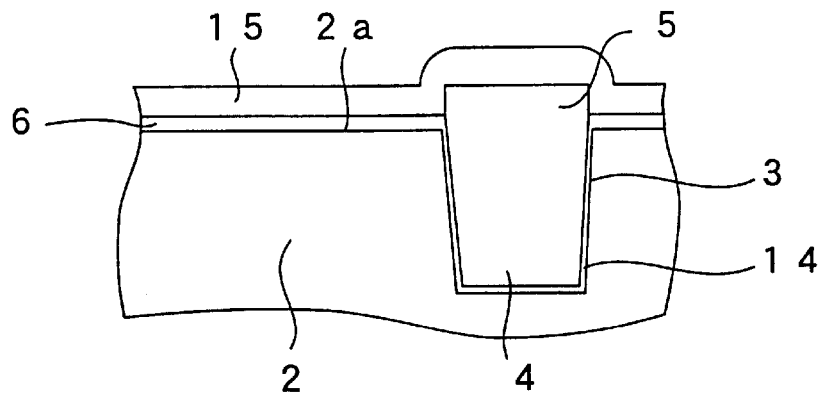
Figure 2G:
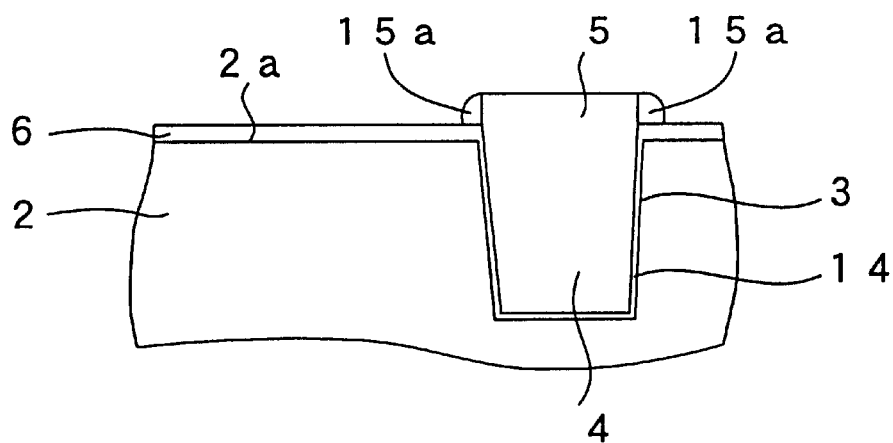
Figure 2H:
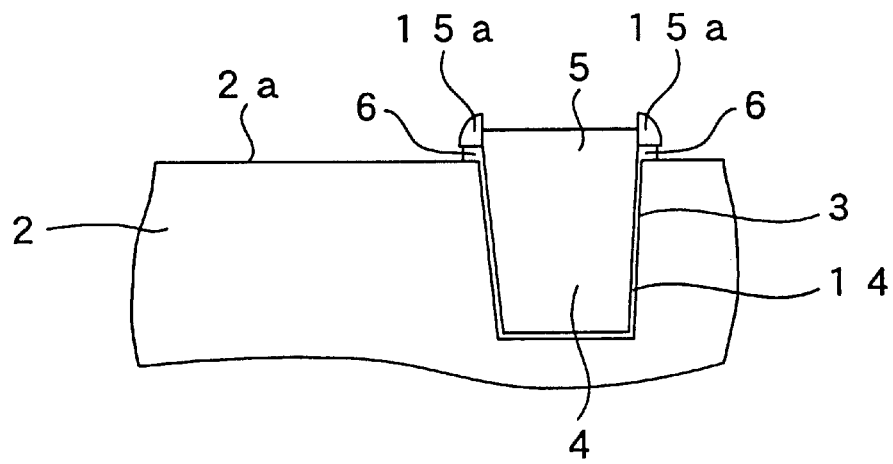
Figure 2I:
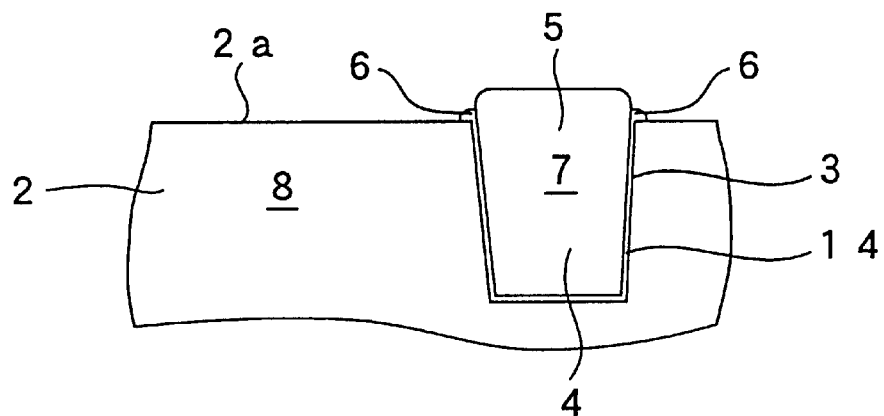
Figure 2J:
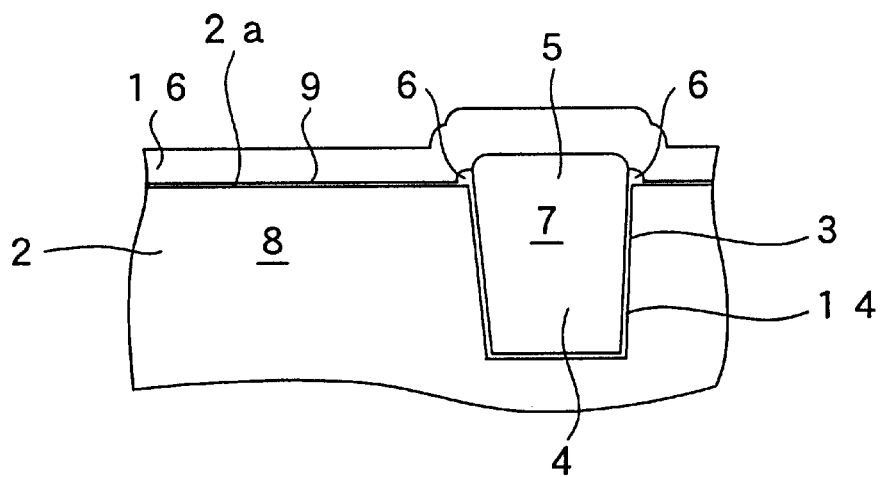

FIG. 1 shows a semiconductor device 1 according to a first embodiment of the present invention, and a plurality of trenches 3 (one only being showy) are formed at predetermined intervals on a main surface 2a which is one (the inner) surface of a silicon substrate 2. In each trench 3, an isolating silicon oxide film 4 is embedded with an upper region 5 of the silicon oxide film 4 protruding from the main surface 2a. A silicon oxide film 6 is formed at a boundary of the upper region 5 in the silicon oxide film 4 and the substrate 2 extending to the main surface 2a of the substrate 2. The height of the silicon oxide film 6 from the main surface 2a is smaller than the height of the upper region 5 of the silicon oxide film 4 from the main surface 2a.

An active region 8 is defined/formed on the surface of the substrate 2 by an isolating film 7 formed of the silicon oxide film 4 and silicon oxide film 6. A gate oxide film 9 is formed on the surface (main surface 2a) of the active region 8, and a gate electrode 10 is formed on the gate oxide film 9 and extends from the top surface of the gate oxide film 9 over part of the top surface of the isolating film 7.

A method of manufacturing the semiconductor device 1 will next be described in order with reference to FIGS. 2A to 2J.

Step 1 (see FIG. 2A): After forming the silicon oxide film 6 with a thickness of 10 to 150 nm on the p-type single-crystal silicon substrate 2 using a thermal oxidizing process, a silicon nitride film 11 with a thickness of 200 nm and a silicon oxide film 12 with a thickness of 50 nm are formed in that order on the silicon oxide film 6 using a CVD process, such as a reduced pressure CVD process, a plasma CVD process, a high density plasma CVD process and a atmospheric CVD process.

Step 2 (see FIG. 2B): A resist 13 formed for the isolating region by a photolithography technique is used as a mask, and the silicon oxide film 6, silicon nitride film 11, and silicon oxide film 12 are etched.

In this case, the reason why the silicon oxide film 12 is formed on the silicon nitride film 11 is that if the resist is directly formed on the silicon nitride film 11 by using a KrF excimer laser stepper without forming the silicon oxide film 12, under the influence of resist inactivation attributed to the silicon nitride film, footing is caused in the chemical amplification type resist on the substrate, thereby causing a problem that a satisfactory resist pattern cannot be formed. The formation of the resist 13 on the silicon oxide film 12 inhibits the problem from occurring, and the etching process using the resist 13 as the mask can be performed with good precision.

Subsequently, after removing the resist 13, the substrate 2 is subjected to anisotropic etching, such as plasma etching, by using the silicon oxide film 6, silicon nitride film 11 and silicon oxide film 12 as the mask, and trench 3 is formed.

Step 3 (see FIG. 2C): By performing thermal oxidation at a temperature of about900° C. to about 1150° C., a thermal oxide film 14 with a thickness of 20 nm is formed on the inner wall of the trench 3.

Step 4 (see FIG. 2D): After performing a CVD process on the entire top surface of the substrate including the inside of the trench 3 to form the silicon oxide film 4, an anisotropic entire-surface etching-back is performed by plasma etching or the like.

In this case, for the etching-back of the silicon oxide films 4, 12 on the silicon nitride film 11, because the silicon nitride film 11 works as an etching stopper providing a difference in etching rate between the silicon oxide films 4, 12 and the silicon nitride film 11, the etching-back is finished while the silicon nitride film 11 is merely exposed.

Additionally, in the present embodiment, when the silicon nitride film 11 is exposed, the etching-back is finished, so that the upper end position of the silicon oxide film 4 in the trench 3 is prevented from becoming lower than the upper end position of the silicon nitride film 11. For this purpose, in the present embodiment, the exposure of the silicon nitride film 11 during the etching-back is detected by detecting the spectrum of nitrogen gas at the start of the etching of the silicon nitride film 11. At the time of this detection, the etching-back is finished.

Alternatively, abrading by a Chemical Mechanical Polishing (CMP) process may be performed instead of the etching-back.

In this case, the exposure of the silicon nitride film 11 can be detected by a difference in hardness between the silicon oxide films 4, 12 and the silicon nitride film 11. Upon this detection, the abrading is finished. Specifically, the hardness of the silicon nitride film 11 is greater than the hardness of the silicon oxide film 4, 12, and the load necessary for the abrading increases when the silicon nitride film 11 is exposed. Therefore, the exposure of the silicon nitride film 11 can be detected by the load increase.

Step 5 (see FIG. 2E): A thermal phosphoric acid solution of 100° C. to 170° C. is used to selectively remove the silicon nitride film 11. Thereby, the upper region 5 of the silicon oxide film 4 protrudes more than the main surface 2a, that is, the top surface of the silicon oxide film 6.

Step 6 (see FIG. 2F): A CVD process is used to form a silicon nitride film 15 on the silicon oxide films 4 and 6.

Step 7 (see FIG. 2G): Plasma etching or the like is used to subject the silicon nitride film 15 to an anisotropic entire-surface etching-back, and a side wall spacer 15a is formed on the side wall of the upper region 5 of the silicon oxide film 4.

Step 8 (see FIG. 2H): The side wall spacer 15a is used as mask, and the silicon oxide film 6 is etched by a wet etching process using hydrofluoric acid. In this case, the silicon oxide film 6 under the side wall spacer 15a is also slightly eroded by the isotropic etching, but is not completely removed by the mask effect of the side wall spacer 15a. As a result, the trench edge of the trench 3 in the substrate 2 is prevented from being exposed, as distinguished from the conventional art.

Step 9 (see FIG. 2I): By removing the side wall spacer 15a by thermal phosphoric acid, the isolating film 7 constituted of the silicon oxide films 4, 6 and thermal oxide film 14 is formed on the substrate 2, thereby defining/forming the active region 8 on the substrate 2.

Step 10 (see FIG. 2J): A thermal oxidation process is used to form a gate oxide film 9 on the top surface of the substrate 2, and further a CVD process is used to form a doped polysilicon film 16 on the entire top surface of the substrate.

Step 11 (see FIG. 1): Photolithography and dry etching techniques are used, and the gate electrode 10 extended from the active region 8 over a portion of the upper part of the isolating film 7 is formed by processing the doped polysilicon film 16.

In this case, in the isolating film 7, as described above, the upper part of the silicon oxide film 4 protrudes upward more than the silicon oxide film 6, and the height of the vertical direction of the upper region 5 is greater than the height of the vertical direction of the silicon oxide film 6.

Figure 3:
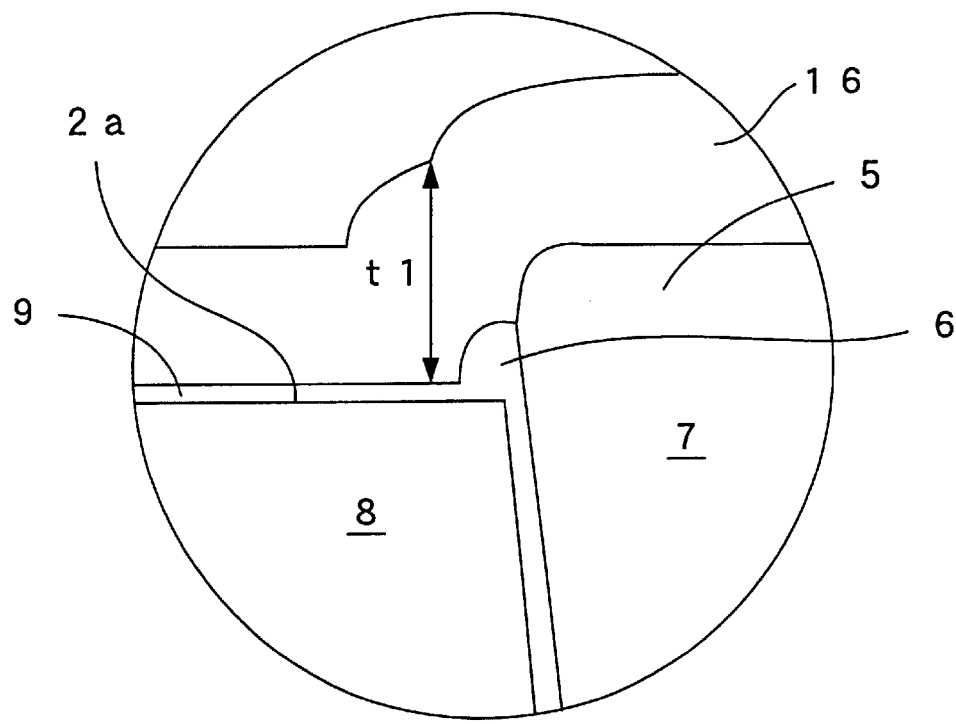
FIG. 3 is an enlarged sectional view of the upper part of an isolating film in the semiconductor device of the first embodiment.

FIG. 3 shows an enlarged section of the left upper part of the isolating film 7 shown in FIG. 1. As shown in FIG. 3, since the height of the vertical direction of the upper region 5 is greater than the height of the vertical direction of the silicon oxide film 6, the step between the substrate surface (main surface 2a) and the top surface of the isolating film 7 increases in a stepwise manner. Therefore, when the polysilicon film 16 is formed from the active region 8 over to the upper part of the isolating film 7, the maximum film thickness t1 of the polysilicon film 16 in the boundary of the isolating film 7 and active region 8 is not greatly increased as compared with the film thickness of the remainder.

Figure 4:
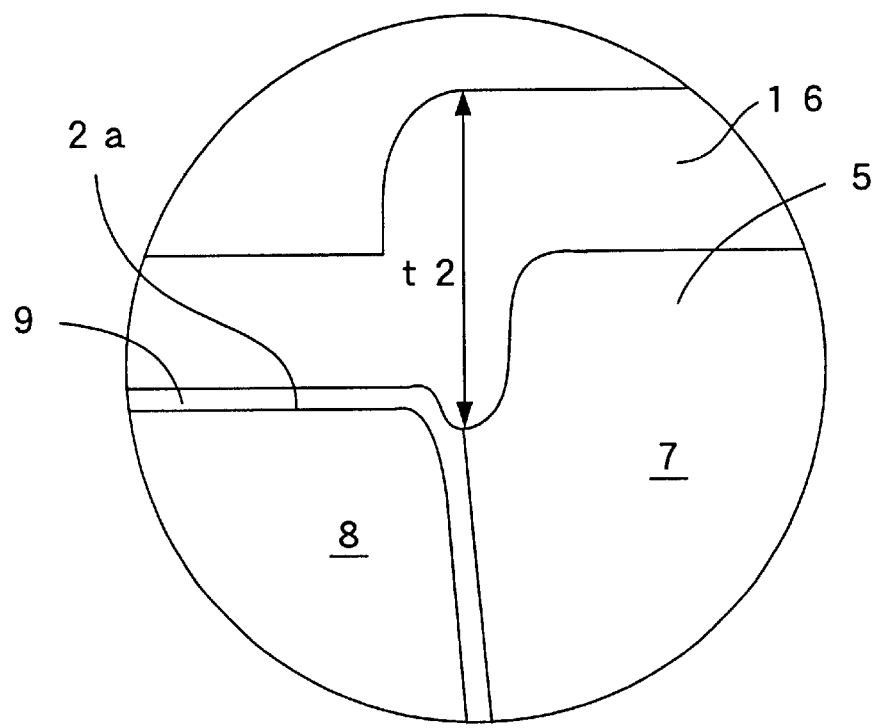
FIG. 4 is an enlarged sectional view of the upper part of the isolating film showing a conventional problem.

For example, as shown in FIG. 4, when no silicon oxide film 6 is present in the isolating film 7, and when the polysilicon film 16 is formed from the active region 8 over to the upper part of the isolating film 7, the maximum film thickness t2 of the polysilicon film 16 in the boundary of the isolating film 7 and active region 8 is greatly increased compared to the film thickness of the remainder. As a result, when the polysilicon film 16 is etched/processed as the gate electrode 10, the unnecessary polysilicon film 16 remains in the boundary, and there arises a problem that the unnecessary polysilicon film 16 is energized in the boundary when the semiconductor device is in use.

On the other hand, in the present embodiment, as described above, since the maximum film thickness t1 of the polysilicon film 16 in the boundary of the isolating film 7 and active region 8 is not greatly increased as compared with the film thickness of the remainder, the unnecessary polysilicon film 16 hardly remains in the boundary.

Therefore, according to the present embodiment, a satisfactory trench isolation structure is obtained, and a highly reliable semiconductor device can be provided.

[Second Embodiment]

A second embodiment of the present invention will next be described with reference to the drawings.

Additionally, the constituting members similar to those of the first embodiment are denoted with the same reference numerals, and the description of the same manufacture processes as those of the first embodiment is omitted or simplified.

Figure 5:
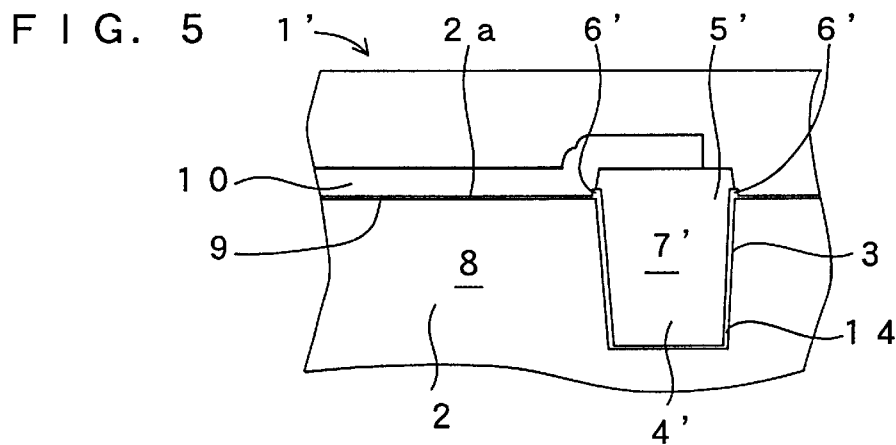
FIG. 5 is a schematic sectional view showing the semiconductor device according to a second embodiment of the present invention.

FIG. 5 shows a semiconductor device 1' of the second embodiment. In this semiconductor device 1', similarly to the first embodiment, the active region 8 is defined/formed on the surface of the substrate 2 by an isolating film 7'. Moreover, the isolating film 7' is formed of silicon oxide films 4', 6' and thermal oxide film 14, and similarly to the first embodiment, the height of the silicon oxide film 6' from the main surface 2a is smaller than the height of an upper region 5' from the main surface 2a in the silicon oxide film 4'.

In the manufacture method of the semiconductor device 1', the second embodiment is different only in the steps 1 to 5 of the semiconductor device 1 of the first embodiment.

First, for the manufacture method of the semiconductor device 1', only the parts different from the first embodiment, that is, the parts corresponding to the steps 1 to 5 will be described hereinafter.

Figure 6A:
FIGS. 6A to 6J are schematic sectional views showing the manufacture process of the semiconductor device of the second embodiment.

In the present embodiment, as shown in FIG. 6A, the thermal oxidation process is first used only to form the silicon oxide film 6' on the substrate 2.

Figure 6B:
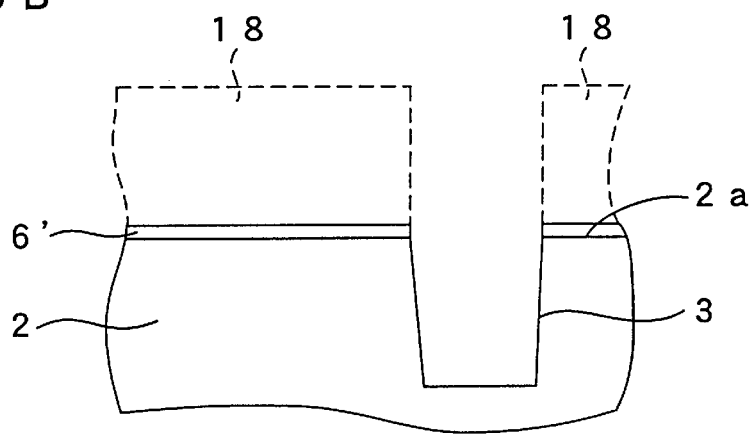

Subsequently, as shown in FIG. 6B, a resist 18 formed for the element isolating region is used as the mask, the silicon oxide film 6' is etched, the resist 18 is then removed, the silicon oxide film 6' is in turn used as the mask, and the anisotropic etching, such as plasma etching, is performed on the substrate 2, and the trench 3 is formed. Additionally, the trench 3 may be formed in one step using the resist 18 as the mask. Specifically, when etching is performed using the resist 18 as the mask, the trench 3 is formed by etching/removing not only the silicon oxide film 6' but also a part of the substrate 2 once.

Figure 6C:
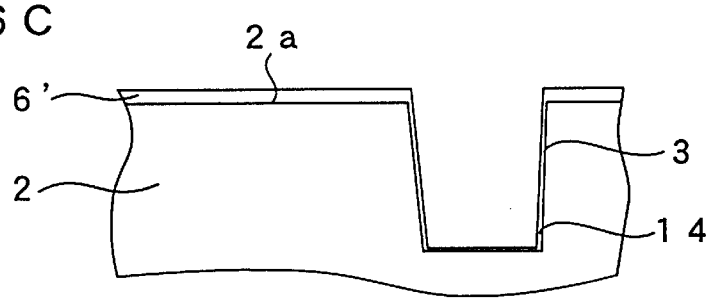
Figure 6D:
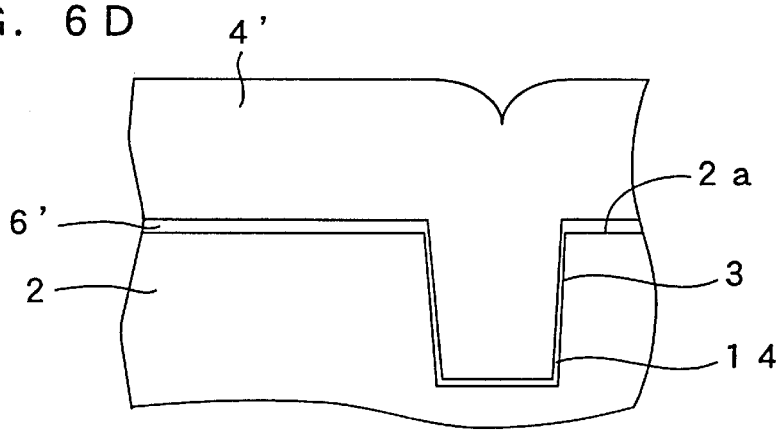

Subsequently, as shown in FIG. 6C, by performing the thermal oxidation at a temperature of about 900° C. to about 1150° C., the thermal oxide film 14 is formed on the inner wall of the trench 3. Thereafter, as shown in FIG. 6D, by performing a CVD process on the entire top surface of the substrate including the inside of the trench 3, the silicon oxide film 4' is formed.

Figure 6E:
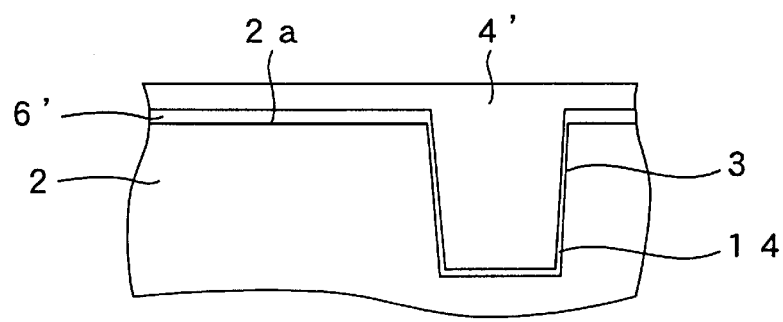
Figure 6F:
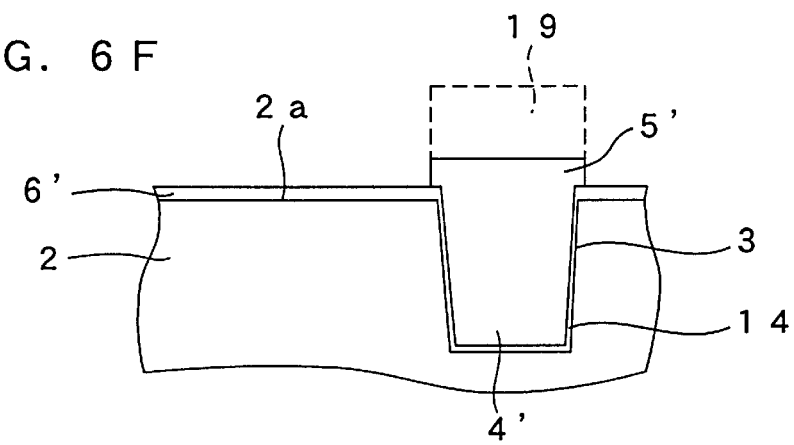

Then, as shown in FIG. 6E, after using a plasma etching technique or the like to etch back the entire surface of the silicon oxide film 4' in an anisotropic manner, as shown in FIG. 6F, a resist 19. is formed, and the part of the silicon oxide film 4' other than the part corresponding to the upper region 5' above the silicon oxide film 4' inside the trench 3 is etched. Subsequently, by removing the resist 19, a state corresponding to the state shown in FIG. 2E of the first embodiment, that is, the state after the end of the fifth step of the first embodiment is obtained.

Additionally, for the etching of the silicon oxide film 4' on the silicon oxide film 6' shown in FIG. 6F, since the silicon oxide film 6' (thermal oxide film) works as an etching stopper because of a difference in etching rate between the silicon oxide film 6' formed by the thermal oxidation and the silicon oxide film 4' formed by the CVD process, the etching is finished, when the silicon oxide film 6' is exposed.

Figure 6G:
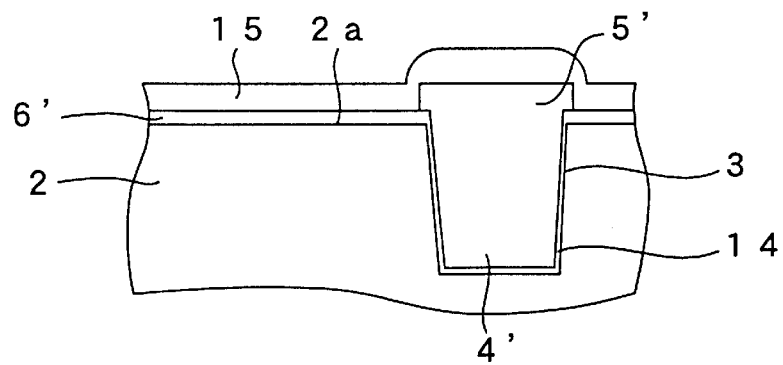
Figure 6H:
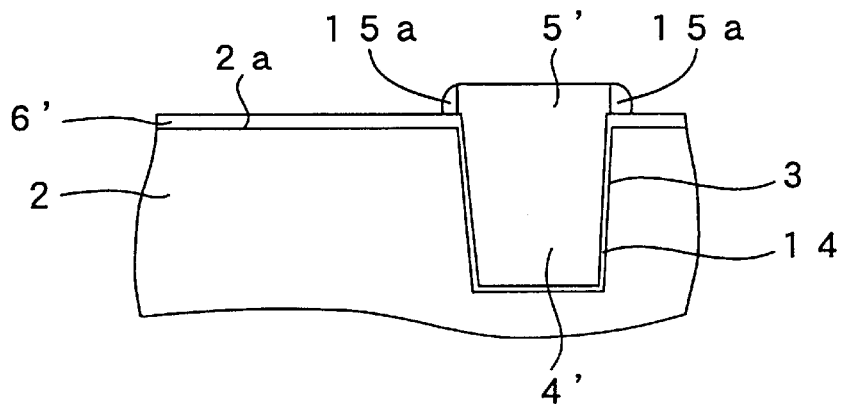
Figure 6I:
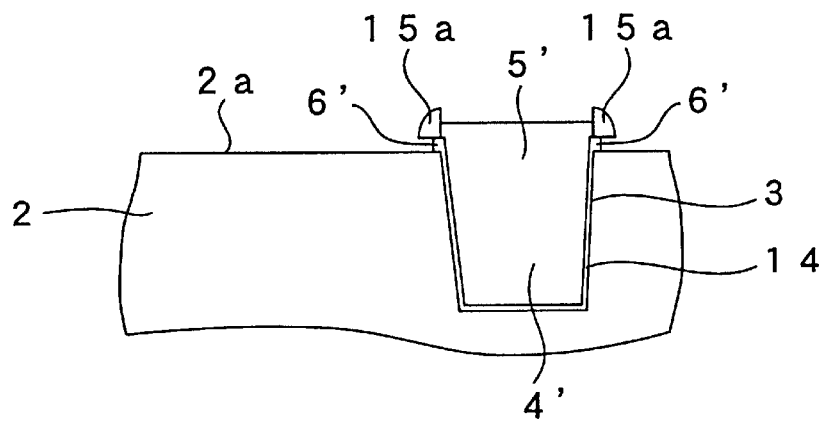
Figure 6J:
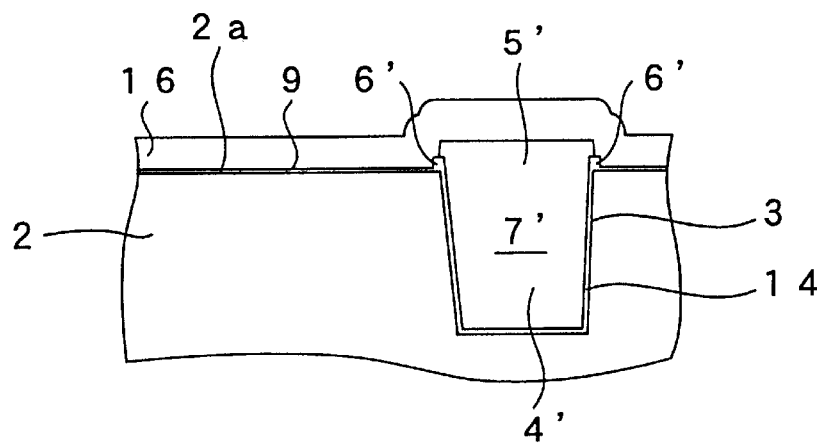
Figure 7A:
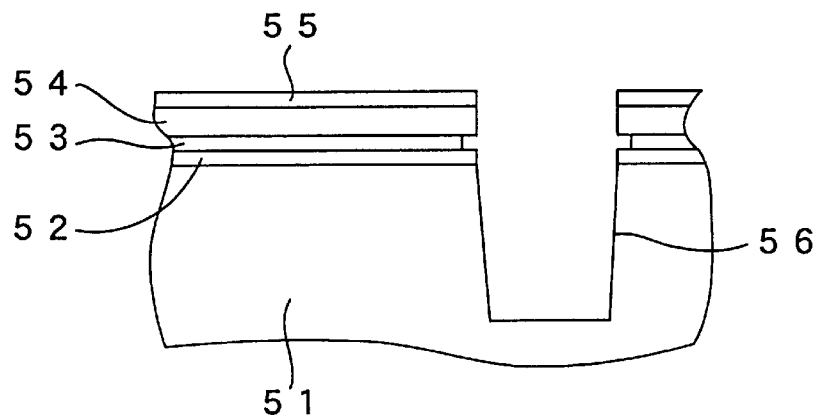
FIGS. 7A to 7C are schematic sectional views showing the manufacture process of a conventional semiconductor device.
Figure 7B:
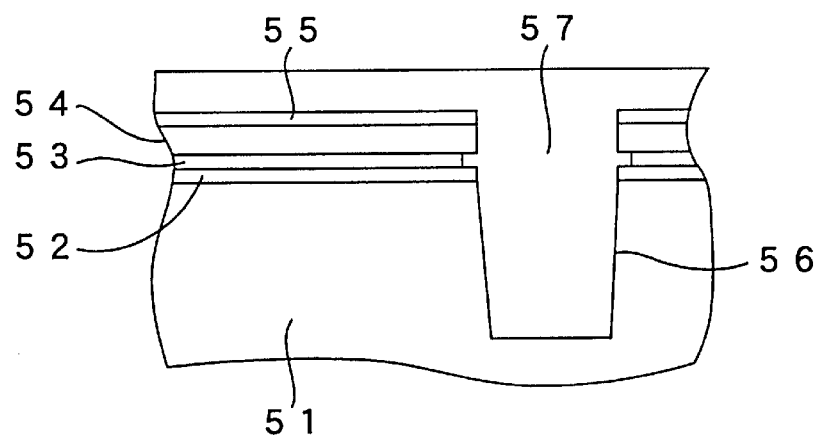
Figure 7C:
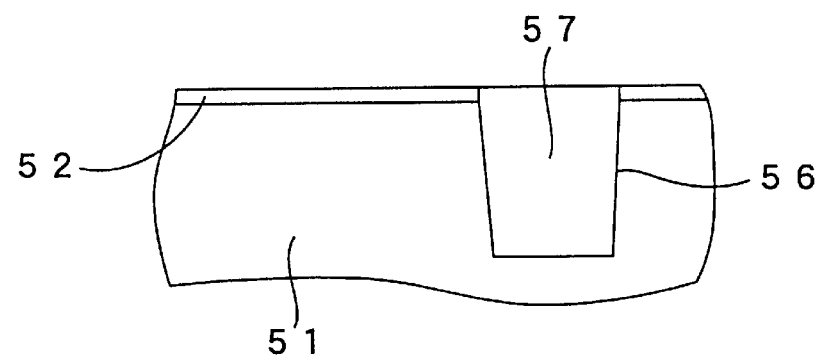
Figure 8:
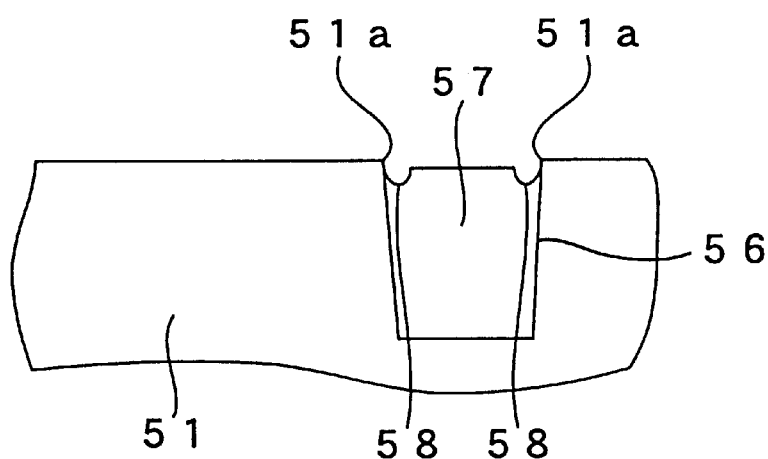
FIGS. 8 is a schematic sectional view showing a problem in the manufacture process of the conventional semiconductor device.

Thereafter, the semiconductor device 1' is formed through the processes similar to those of the first embodiment. Specifically, as shown in FIG. 6G, after forming the silicon nitride film 15 using the CVD process on the silicon oxide films 4' and 6', the silicon nitride film 15 is subjected to the anisotropic entire surface etching-back and, as shown in FIG. 6H, the side wall spacer 15*a* is formed on the side wall of the upper region 5' of the silicon oxide film 4'. Subsequently, as shown in FIG. 6I, after using the side wall spacer 15*a* as the mask to etch the silicon oxide film 6', and then removing the side wall spacer 15*a*, the isolating film 7' consisting of the silicon oxide films 4', 6' and thermal oxide film 14 is formed. Then, after forming the gate oxide film 9 on the top surface of the substrate 2, the doped polysilicon film 16 is formed on the entire top surface of the substrate by the CVD process, and the polysilicon film 16 is etched to form the gate electrode 10, thereby obtaining the state shown in FIG. 5.

Furthermore, also in the semiconductor device 1' of the present embodiment, as described above, since the upper part of the silicon oxide film 4' protrudes upward more than the silicon oxide film 6', and the height of the vertical direction of the upper region 5' is greater than the height of the vertical direction of the silicon oxide film 6', the actions/effects similar to those of the first embodiment can be obtained.

What is claimed is:

1. A semiconductor device comprising:

a substrate having a trench in a main surface of the substrate;

a conductive layer; and an isolating film located in said trench, said isolating film comprising:
a main body region positioned in said trench;
a first region protruding upward from said main body region and positioned above said main surface and
a second region extending along said main surface from a side surface of said first region and having a smaller height of a vertical direction from said main surface than the height of the vertical direction of said first region,
wherein said conductive layer is positioned directly over said second region at said side surface of said first region.

2. The semiconductor device according to claim 1, further comprising a conductive layer extending over the upper part of said isolating film from said main surface.

* * * * *